United States Patent
Mu

(10) Patent No.: US 9,887,383 B2
(45) Date of Patent: Feb. 6, 2018

(54) ENCAPSULATING STRUCTURE OF FLEXIBLE OLED DEVICE AND FLEXIBLE DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Junying Mu, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 143 days.

(21) Appl. No.: 14/785,613

(22) PCT Filed: Sep. 25, 2015

(86) PCT No.: PCT/CN2015/090811
§ 371 (c)(1),
(2) Date: Oct. 19, 2015

(87) PCT Pub. No.: WO2017/049627
PCT Pub. Date: Mar. 30, 2017

(65) Prior Publication Data
US 2017/0155082 A1    Jun. 1, 2017

(30) Foreign Application Priority Data

Sep. 22, 2015    (CN) .......................... 2015 1 0609543

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3244* (2013.01); *H01L 51/0097* (2013.01);
(Continued)

(58) Field of Classification Search
None
See application file for complete search history.

(56) References Cited

U.S. PATENT DOCUMENTS 7,812,531 B2 * 10/2010 Boroson ............... H01L 51/524
313/512
2011/0049730 A1 * 3/2011 Schmid ............... C23C 16/0272
257/787

(Continued)

FOREIGN PATENT DOCUMENTS

| CN | 102496683 A | 6/2012 |
| CN | 102664239 A | 9/2012 |
| CN | 104659051 A | 5/2015 |

*Primary Examiner* — Michael Lebentritt
(74) *Attorney, Agent, or Firm* — Andrew C. Cheng

(57) ABSTRACT

An encapsulating structure for encapsulating a flexible OLED device includes a flexible substrate, a first flexible thin film encapsulating layer, a TFT array, an OLED device, a second flexible thin film encapsulating layer, an adhesion layer, a third flexible thin film encapsulating layer, and a polarizer layered in order. One or more barrier layers are arranged on the TFT array disposed on lateral sides of the OLED device, and the second flexible thin film encapsulating layer covers the OLED device and the one or more barrier layers. The present invention also proposes a display device having the encapsulating structure.

18 Claims, 2 Drawing Sheets

(52) U.S. Cl.
CPC .... *H01L 51/5293* (2013.01); *H01L 2251/301* (2013.01); *H01L 2251/303* (2013.01); *H01L 2251/5338* (2013.01)

(56) References Cited

U.S. PATENT DOCUMENTS

| | | | | |
|---|---|---|---|---|
| 2011/0132449 | A1* | 6/2011 | Ramadas | H05B 33/04 136/256 |
| 2014/0159046 | A1* | 6/2014 | Deng | H01L 27/1218 257/72 |
| 2014/0166998 | A1* | 6/2014 | Lee | H01L 27/3276 257/40 |
| 2014/0353625 | A1* | 12/2014 | Yi | H01L 51/5253 257/40 |
| 2016/0306460 | A1* | 10/2016 | Lee | H01L 27/323 |
| 2017/0033313 | A1* | 2/2017 | Kim | H01L 27/32 |
| 2017/0054108 | A1* | 2/2017 | Kim | H01L 27/3258 |
| 2017/0062757 | A1* | 3/2017 | Zhou | H01L 51/5237 |

\* cited by examiner

ENCAPSULATING STRUCTURE OF FLEXIBLE OLED DEVICE AND FLEXIBLE DISPLAY DEVICE

BACKGROUND OF THE INVENTION

1. Field of the Invention

The present invention relates to the field of display technology, and more particularly, to an encapsulating structure for encapsulating a flexible organic light-emitting diode (OLED) device and a flexible display device with the encapsulating structure.

2. Description of the Prior Art

Organic light-emitting diode (OLED) devices have a feature of self-emission. A very thin organic coating layer and a glass substrate are adopted by the OLED devices. When electric current flows, organic material emits light. In contrast to the conventional liquid crystal panels, active matrix organic light emitting diode (AMOLED) panels have features of rapid response, high contrast, wide viewing angle, etc. In addition, the AMOLED panels have a feature of self-emission without using backlight modules. Compared with the conventional liquid crystal panels, the AMOLED panels are thinner and lighter. Also, costs are reduced because backlight modules are not used in the AMOLED panels. Owing to the features and advantages, the AMOLED panels are of good prospect.

OLED devices have more advantages and have good prospects. But, the reactive metal formed the metallic cathode in OLED devices is highly sensitive to water vapor and oxygen in the air. The reactive metal is inclined to react with the seeped water vapor and oxygen, which easily affects the injection of electric charge. Besides, the seeped water vapor and oxygen tends to react with organic material chemically. Such reactions are the main causes of poor performance of OLED devices and short lifespan of OLED devices. Thus, the encapsulating technique is very important for OLED devices. Currently, there are many methods for encapsulating OLED devices such as the glass encapsulating method, the frit encapsulating method, and the thin film encapsulation (TFE) method. The most ordinary method of the TFE method is to encapsulate OLED devices with transparent thin films. The encapsulation method has advantages of operating simply and keeping the encapsulated items light and thin.

Moreover, an outstanding feature of the OLED devices is to display flexibly. One important development for the OLED devices is adoption of bendable, lightweight, and portable flexible display devices fabricated from flexible substrates. Flexible OLED devices have been thrown to the market. Flexible thin film encapsulating is adopted by flexible OLED devices, which means whether flexible thin film encapsulating can effectively blocking off water vapor and oxygen or not is a key factor of lifespan of the devices. If flexible material is substituted for glass substrates and encapsulating covers having an excellent quality of blocking off water vapor and oxygen, then the problem of blocking off water vapor and oxygen has to be resolved. FIG. 1 shows an encapsulating structure of a conventional flexible OLED device. As FIG. 1 shows, the encapsulating structure comprises a rigid substrate 1 (can be removed after the whole encapsulating structure is completed), a flexible substrate 2, a first flexible thin film encapsulating layer 3, a thin-film transistor (TFT) array 4, an OLED device 5, a second flexible thin film encapsulating layer 6, an adhesion layer 7, a third flexible thin film encapsulating layer 8, and a polarizer 9 layered in order. The second flexible thin film encapsulating layer 6 covers the top side and the lateral sides of the OLED device 5. The rigid substrate 1 can be fabricated as a grid substrate for fulfilling the requirement of flexibility of the whole encapsulating structure. The flexible substrate 2 can be fabricated by material such as polyimide (PI) or polyethylene terephthalate (PET). The first flexible thin film encapsulating layer 3, the second flexible thin film encapsulating layer 6, and the third flexible thin film encapsulating layer 8 are formed by inorganic barrier layers and organic buffer layers layered alternatively.

In addition to the flexible thin film encapsulating layers arranged on the bottom side and top side of the above-mentioned OLED devices, the OLED devices further comprise more structural layers for blocking off water vapor and oxygen, which completely fulfills the demands of the lifespan of the OLED device. But, the lateral sides of the OLED devices only comprise a flexible thin film encapsulating layer and an adhesion layer for blocking off water vapor and oxygen. The adhesion layer is poorer for blocking off water vapor and oxygen. Because the material for the flexible thin film encapsulating layer is restricted, only the flexible thin film encapsulating layers can be arranged on the lateral sides of the OLED devices for blocking off water vapor and oxygen, which cannot fulfill the demands of the lifespan of the OLED device.

SUMMARY OF THE INVENTION

In view of this, an object of the present invention is to propose an encapsulating structure of a flexible OLED device. The present encapsulating structure is effective for improving the encapsulating structure of the lateral sides of the flexible OLED device. The feature of the present encapsulating structure is to block off water vapor and oxygen so that the lifespan of the OLED device can be prolonged.

According to the present invention, an encapsulating structure for encapsulating a flexible organic light-emitting diode (OLED) device comprises a flexible substrate, a first flexible thin film encapsulating layer, a thin-film transistor (TFT) array, an OLED device, a second flexible thin film encapsulating layer, an adhesion layer, a third flexible thin film encapsulating layer, and a polarizer layered in order. One or more barrier layers are arranged on the TFT array disposed on lateral sides of the OLED device, and the second flexible thin film encapsulating layer covers the OLED device and the one or more barrier layers.

Furthermore, two barrier layers are disposed at intervals on the lateral sides of the flexible OLED device.

Furthermore, the cross section of the barrier layer is trapezoidal in shape.

Furthermore, the barrier layer is fabricated from a negative photoresist.

Furthermore, the TFT array is set as a reference point, and height of the barrier layer is larger than height of the OLED device.

Furthermore, the TFT array is set as a reference point, and height of the barrier layer is larger than height of the OLED device.

Furthermore, the flexible substrate is fabricated from either polyimide (PI) or polyethylene terephthalate (PET).

Furthermore, the first flexible thin film encapsulating layer, the second flexible thin film encapsulating layer, and the third flexible thin film encapsulating layer all comprise an inorganic barrier layer and an organic buffer layer layered alternatively.

Furthermore, the inorganic barrier layer comprises a plurality of layers fabricated by one or more materials selecting from $Al_2O_3$, $SiN_x$, or SiCN, and the organic buffer layer comprises a plurality of layers fabricated by one or more materials selecting from pp-HMDSO, Arcyl, or Alucone.

Furthermore, the OLED device comprises an anode formed on the TFT array, an organic function layer formed on the anode, and a cathode formed on the organic function layer.

According to the present invention, a flexible display device comprises an encapsulating structure for encapsulating a flexible organic light-emitting diode (OLED) device as mentioned above and a driving module.

Compared with the prior art, The encapsulating structure for encapsulating the flexible organic light-emitting diode (OLED) device proposed by the present invention is that, the first step of arranging one or more barrier layer on the lateral sides of the OLED device, and the second step of covering a flexible thin film encapsulating layer on the one or more barrier layer. Water vapor and oxygen can be blocked off much better by the lateral sides of the OLED device using the present flexible OLED device so that the lifespan of the OLED device can be prolonged.

DETAILED DESCRIPTION OF THE PREFERRED EMBODIMENTS

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

The accompanying drawings illustrate embodiments of the invention and, together with the description, serve to explain the principles of the invention. The irrelevant structure or/and steps are omitted.

Figure 1:
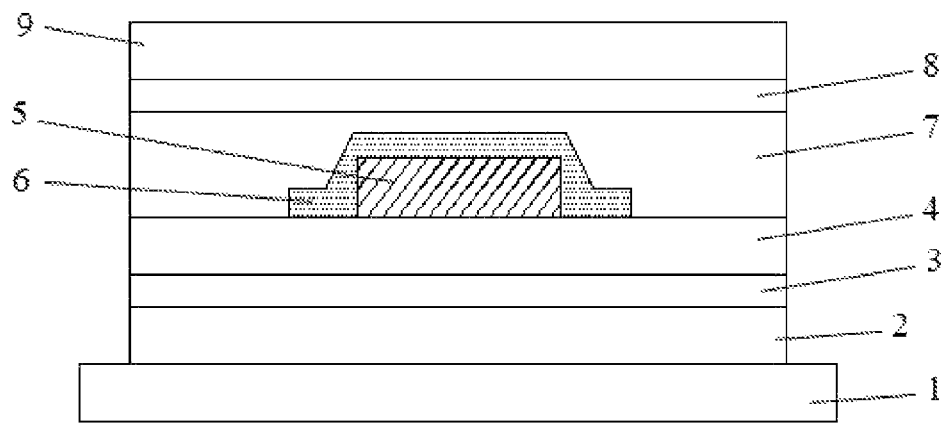
FIG. 1 shows a conventional encapsulating structure of the flexible OLED device.
Figure 2:
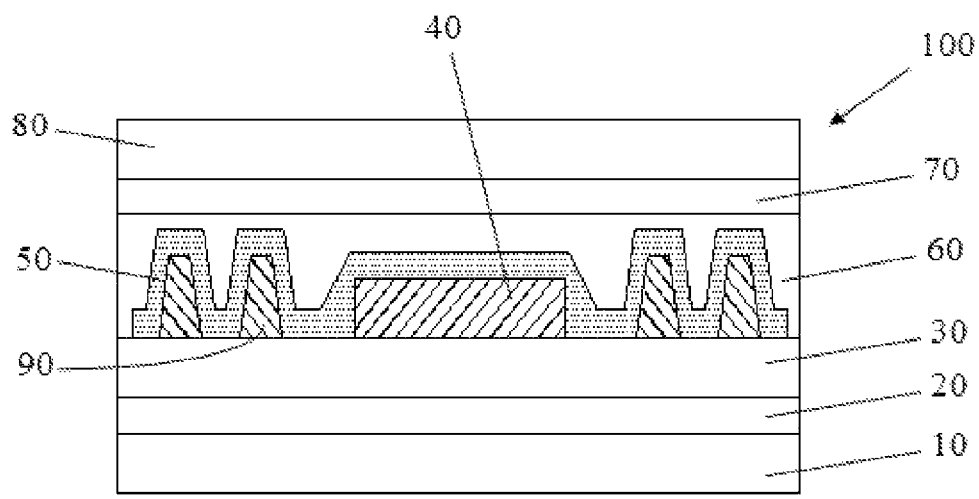
FIG. 2 shows an encapsulating structure of the flexible OLED device according to a preferred embodiment of the present invention.
Figure 3:
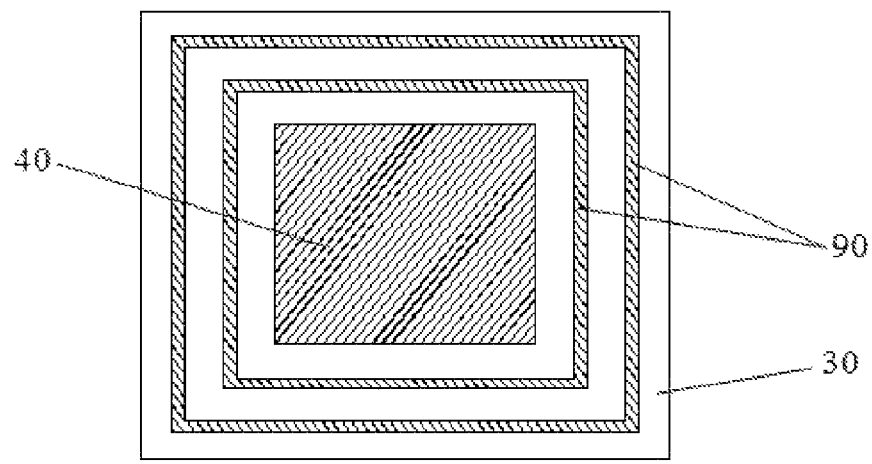
FIG. 3 shows a top view of the barrier layer according to a preferred embodiment of the present invention.

An encapsulating structure 100 comprising a flexible OLED device is proposed by the present embodiment. As FIG. 2 shows, the encapsulating structure 100 comprises a flexible substrate 10, a first flexible thin film encapsulating layer 20, a TFT array 30, an OLED device 40, a second flexible thin film encapsulating layer 50, an adhesion layer 60, a third flexible thin film encapsulating layer 70, and a polarizer 80 layered in order. Please refer to FIG. 2 and FIG. 3. Two barrier layers 90 are disposed at intervals on the lateral sides of the OLED device 40 of the TFT array 30. The second flexible thin film encapsulating layer 50 covers the OLED device 40 and the barrier layers 90. It is notified that it is possible that only one barrier layer 90 is used in one embodiment. It is also possible that a plurality of barrier layers 90 are adopted in one embodiment.

Because the barrier layer 90 is arranged on the lateral sides of the OLED device 40 in the encapsulating structure 100, exterior water vapor and oxygen is blocked off by both of the barrier layer 90 and the second flexible thin film encapsulating layer 50. Since the sides of the OLED device 40 blocks off water vapor and oxygen better, the lifespan of the OLED device is prolonged.

The barrier layer 90 can be fabricated from a negative photoresist.

As FIG. 2 shows, the cross section of the barrier layer 90 is trapezoidal in shape. The structure of the barrier layer 90 can be a trapezoidal abutment with a larger slope so that the second flexible thin film encapsulating layer 50 can cover the barrier layer 90 better. Also, the second flexible thin film encapsulating layer 50 and the barrier layer 90 can match better.

Please refer to FIG. 2. The TFT array 30 is set as a reference point. The height of the barrier layer 90 is larger than the height of the OLED device 40 for achieving a better effect of blocking off water vapor and oxygen. It is notified that, in general, the TFT array 30 comprises a TFT display section and an encapsulating section located on the periphery of the display section (not shown). The OLED device 40 is arranged on the display section. The barrier layer 90 is arranged on the encapsulating section.

Figure 4:
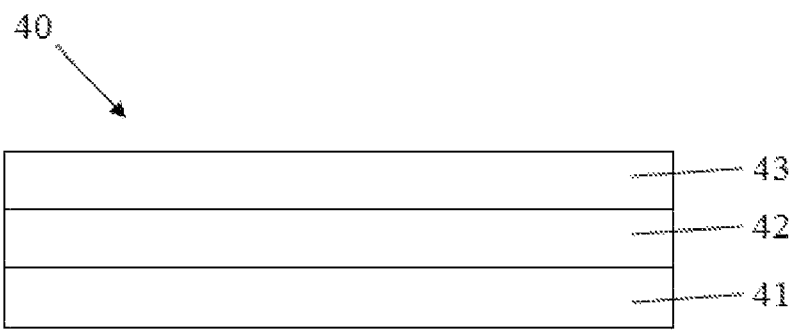
FIG. 4 illustrates a schematic diagram of the OLED device according to a preferred embodiment of the present invention.

Please refer to FIG. 4. The OLED device 40 comprises an anode 41 formed on the TFT array 30, an organic function layer 42 formed on the anode 41, and a cathode 43 formed on the organic function layer 42. The anode 41 and the cathode 43 excite the organic function layer 42 for successful display. The organic function layer 42 is formed by three function layers (not shown). The three function layers are a hole transport layer (HTL), an emissive layer (EML), and an electron transport layer (ETL). Each of the three function layers may be a single layer or more than one layer. For example, the HTL may further comprise a hole injection layer and a hole transportation layer, or the ETL may further comprise an electron transportation layer and an electron injection layer. The functions of the hole injection layer and the functions of the hole transportation layer are similar so they are taken as the HTL. The functions of theses layers are similar so they are regarded as the HTL and the ETL in general.

The flexible substrate 10 can be fabricated from either polyimide (PI) or polyethylene terephthalate (PET).

Figure 5:
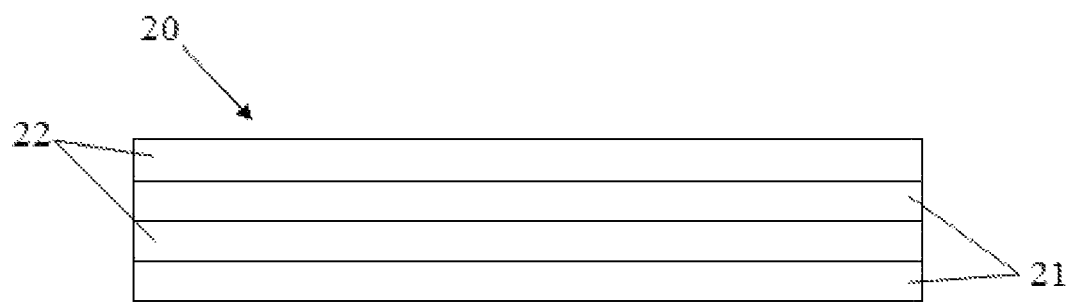
FIG. 5 shows a flexible thin film encapsulating structure layer according to a preferred embodiment of the present invention.

The first flexible thin film encapsulating layer 20, the second flexible thin film encapsulating layer 50, and the third flexible thin film encapsulating layer 70 all comprise an inorganic barrier layer and an organic buffer layer layered alternatively. Take the first flexible thin film encapsulating layer 20 for example. Please refer to FIG. 5. The first flexible thin film encapsulating layer 20 comprises a first organic buffer layer 21, a first inorganic barrier layer 22, a second organic buffer layer 21, and a second inorganic barrier layer 22 layered alternatively. Both of the second flexible thin film encapsulating layer 50 and the third flexible thin film encapsulating layer 70 also have the structure as mentioned above. When it comes to the number of the organic buffer layer 21 and the number of the inorganic barrier layer 22 used for alternative arrangement, practical demands are taken into considerations. In general, it is positively related between the capacity of the flexible thin film encapsulating layers to block off water vapor and oxygen and the number of layers of the flexible thin film encapsulating layers. The inorganic barrier layer can be fabricated from material such as $Al_2O_3$, $SiN_x$, or SiCN. Also, the inorganic barrier layer can comprise a plurality of arbitrary layers fabricated from two or more than two kinds of materials. The organic buffer layer can be fabricated from material such as pp-HMDSO, Arcyl, or Alucone. Also, the inorganic barrier layer can comprise a plurality of arbitrary layers fabricated from two or more than two kinds of materials.

Figure 6:
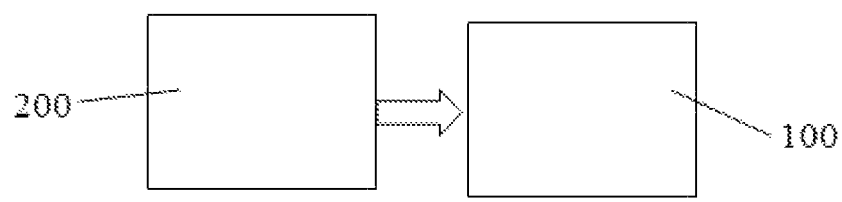
FIG. 6 shows a block diagram of the flexible display device according to a preferred embodiment of the present invention.

Further, a flexible display device is proposed by the present embodiment. As FIG. 6 shows, the flexible display device comprises the encapsulating structure 100 comprising the flexible OLED device and a driving module 200. The driving module 200 is used for supplying the encapsulating structure 100 comprising the flexible OLED device with a driving signal so that the flexible OLED device can illuminate.

To sum up, the encapsulating structure comprising the flexible OLED device proposed by the present invention is that, the first step of arranging one or more barrier layer on the lateral sides of the OLED device, and the second step of covering a flexible thin film encapsulating layer on the one or more barrier layer. Water vapor and oxygen can be blocked off much better by the lateral sides of the OLED device so that the lifespan of the OLED device can be prolonged.

The terms "a" or "an", as used herein, are defined as one or more than one. The term "another", as used herein, is defined as at least a second or more. The terms "including" and/or "having" as used herein, are defined as comprising. It should be noted that if it is described in the specification that one component is "connected," "coupled" or "joined" to another component, a third component may be "connected," "coupled," and "joined" between the first and second components, although the first component may be directly connected, coupled or joined to the second component.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. An encapsulating structure for encapsulating a flexible organic light-emitting diode (OLED) device, comprising: a flexible substrate, a first flexible thin film encapsulating layer, a thin-film transistor (TFT) array, an OLED device, a second flexible thin film encapsulating layer, an adhesion layer, a third flexible thin film encapsulating layer, and a polarizer layered in order wherein one or more barrier layers are arranged on the TFT array disposed on lateral sides of the OLED device, and the second flexible thin film encapsulating layer covers the OLED device and the one or more barrier layers,
    wherein the OLED device comprises an anode formed on the TFT array, an organic function layer formed on the anode, and a cathode formed on the organic function layer.

2. The encapsulating structure for encapsulating the flexible organic light-emitting diode (OLED) device of claim 1, wherein two barrier layers are disposed at intervals on the lateral sides of the flexible OLED device.

3. The encapsulating structure for encapsulating the flexible organic light-emitting diode (OLED) device of claim 1, wherein the cross section of the barrier layer is trapezoidal in shape.

4. The encapsulating structure for encapsulating the flexible organic light-emitting diode (OLED) device of claim 1, wherein the barrier layer is fabricated from a negative photoresist.

5. The encapsulating structure for encapsulating the flexible organic light-emitting diode (OLED) device of claim 1, wherein the TFT array is set as a reference point, and height of the barrier layer is larger than height of the OLED device.

6. The encapsulating structure for encapsulating the flexible organic light-emitting diode (OLED) device of claim 3, wherein the TFT array is set as a reference point, and height of the barrier layer is larger than height of the OLED device.

7. The encapsulating structure for encapsulating the flexible organic light-emitting diode (OLED) device of claim 1, wherein the flexible substrate is fabricated from either polyimide (PI) or polyethylene terephthalate (PET).

8. The encapsulating structure for encapsulating the flexible organic light-emitting diode (OLED) device of claim 1, wherein the first flexible thin film encapsulating layer, the second flexible thin film encapsulating layer, and the third flexible thin film encapsulating layer all comprise an inorganic barrier layer and an organic buffer layer layered alternatively.

9. The encapsulating structure for encapsulating the flexible organic light-emitting diode (OLED) device of claim 8, wherein the inorganic barrier layer comprises a plurality of layers fabricated by one or more materials selecting from $Al_2O_3$, $SiN_x$, or SiCN, and the organic buffer layer comprises a plurality of layers fabricated by one or more materials selecting from pp-HMDSO, Arcyl, or Alucone.

10. A flexible display device comprising an encapsulating structure for encapsulating a flexible organic light-emitting diode (OLED) device and a driving module, the encapsulating structure comprising: a flexible substrate, a first flexible thin film encapsulating layer, a thin-film transistor (TFT) array, an OLED device, a second flexible thin film encapsulating layer, an adhesion layer, a third flexible thin film encapsulating layer, and a polarizer layered in order wherein one or more barrier layers are arranged on the TFT array disposed on lateral sides of the OLED device, and the second flexible thin film encapsulating layer covers the OLED device and the one or more barrier layers,
    wherein the OLED device comprises an anode formed on the TFT array, an organic function layer formed on the anode, and a cathode formed on the organic function layer.

11. The flexible display device of claim 10, wherein two barrier layers are disposed at intervals on the lateral sides of the flexible OLED device.

12. The flexible display device of claim 10, wherein the cross section of the barrier layer is trapezoidal in shape.

13. The flexible display device of claim 10, wherein the barrier layer is fabricated from a negative photoresist.

14. The flexible display device of claim 10, wherein the TFT array is set as a reference point, and height of the barrier layer is larger than height of the OLED device.

15. The flexible display device of claim 12, wherein the TFT array is set as a reference point, and height of the barrier layer is larger than height of the OLED device.

16. The flexible display device of claim 10, wherein the flexible substrate is fabricated from either polyimide (PI) or polyethylene terephthalate (PET).

17. The flexible display device of claim 10, wherein the first flexible thin film encapsulating layer, the second flexible thin film encapsulating layer, and the third flexible thin film encapsulating layer all comprise an inorganic barrier layer and an organic buffer layer layered alternatively.

18. The flexible display device of claim 17, wherein the inorganic barrier layer comprises a plurality of layers fabricated by one or more materials selecting from $Al_2O_3$, $SiN_x$, or SiCN, and the organic buffer layer comprises a plurality of layers fabricated by one or more materials selecting from pp-HMDSO, Arcyl, or Alucone.

* * * * *